United States Patent
Canaperi et al.

(10) Patent No.: US 9,607,825 B2
(45) Date of Patent: Mar. 28, 2017

(54) HYDROGEN-FREE SILICON-BASED DEPOSITED DIELECTRIC FILMS FOR NANO DEVICE FABRICATION

(71) Applicant: International Business Machines Corporation, Armonk, NY (US)

(72) Inventors: Donald Francis Canaperi, Bridgewater, CT (US); Alfred Grill, White Plains, NY (US); Sanjay C. Mehta, Niskayuna, NY (US); Son Van Nguyen, Schenectady, NY (US); Deepika Priyadarshini, Guilderland, NY (US); Hosadurga Shobha, Niskayuna, NY (US); Matthew T. Shoudy, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 81 days.

(21) Appl. No.: 14/247,559

(22) Filed: Apr. 8, 2014

(65) Prior Publication Data
US 2015/0287593 A1    Oct. 8, 2015

(51) Int. Cl.
*H01L 21/20* (2006.01)
*H01L 21/02* (2006.01)
(Continued)

(52) U.S. Cl.
CPC ...... *H01L 21/02274* (2013.01); *C23C 16/345* (2013.01); *C23C 16/401* (2013.01);
(Continued)

(58) Field of Classification Search
None
See application file for complete search history.

(56) References Cited

U.S. PATENT DOCUMENTS 8,652,950 B2   2/2014  Nguyen et al.
8,809,170 B2 *  8/2014  Bauer ............... H01L 21/02532
                                                    438/494
(Continued)

OTHER PUBLICATIONS

Misra, D.; Role of Hydrogen in Dielectrics for Electronics and Optoelectronics Devices; The Electrochemical Society, 223rd ECS Meeting, 2013.
(Continued)

*Primary Examiner* — Zandra Smith
*Assistant Examiner* — Andre' C Stevenson
(74) *Attorney, Agent, or Firm* — Steven J. Meyers; Howard M. Cohn

(57) ABSTRACT

Embodiments of the present invention provide hydrogen-free dielectric films and methods of fabrication. A hydrogen-free precursor, such as tetraisocyanatosilane, and hydrogen-free reactants, such as nitrogen, oxygen (O2/O3) and nitrous oxide are used with chemical vapor deposition processes (PECVD, thermal CVD, SACVD, HDP CVD, and PE and Thermal ALD) to create hydrogen-free dielectric films. In some embodiments, there are multilayer dielectric films with sublayers of various materials such as silicon oxide, silicon nitride, and silicon oxynitride. In embodiments, the hydrogen-free reactants may include Tetra Isocyanato Silane, along with a hydrogen-free gas including, but not limited to, N2, O2, O3, N2O, CO2, CO and a combination thereof of these H-Free gases. Plasma may be used to enhance the reaction between the TICS and the other H-free gasses. The plasma may be controlled during film deposition to achieve variable density within each sublayer of the films.

7 Claims, 10 Drawing Sheets

(51) Int. Cl.
*H01L 23/532* (2006.01)
*H01L 29/51* (2006.01)
*C23C 16/34* (2006.01)
*C23C 16/40* (2006.01)
*C23C 16/455* (2006.01)
*H01L 23/522* (2006.01)
*H01L 23/528* (2006.01)
*H01L 29/423* (2006.01)
*H01L 29/49* (2006.01)
*H01L 29/78* (2006.01)
*H01L 23/485* (2006.01)

(52) U.S. Cl.
CPC .... *C23C 16/45525* (2013.01); *H01L 21/0214* (2013.01); *H01L 21/0217* (2013.01); *H01L 21/02123* (2013.01); *H01L 21/02126* (2013.01); *H01L 21/02164* (2013.01); *H01L 21/02211* (2013.01); *H01L 21/02214* (2013.01); *H01L 21/02219* (2013.01); *H01L 21/02299* (2013.01); *H01L 23/528* (2013.01); *H01L 23/5226* (2013.01); *H01L 23/5329* (2013.01); *H01L 23/53295* (2013.01); *H01L 29/42364* (2013.01); *H01L 29/4983* (2013.01); *H01L 29/511* (2013.01); *H01L 29/513* (2013.01); *H01L 29/78* (2013.01); *H01L 23/485* (2013.01); *H01L 23/53276* (2013.01); *H01L 2924/0002* (2013.01)

(56) References Cited

U.S. PATENT DOCUMENTS 9,127,345 B2 * 9/2015 Cody ............... H01L 21/02381
2003/0148194 A1 * 8/2003 Brown ............... C03B 19/1407
430/5
2011/0042801 A1 2/2011 Mohanakrishnaswamy et al.
2012/0045904 A1 * 2/2012 Choi ..................... C23C 16/308
438/786

OTHER PUBLICATIONS

Efthymiou, E. et al.; Reliability degradation of thin HfO2/SiO2 gate stacks by remote RF hydrogen and deuterium plasma treatment; Thin Solid Films 517, 2008, pp. 207-208.
Lee, Ga-Won et al.; Effect on The Gate Dielectric Integrity and The MOSFET Characteristics of Oxide Charges at the Edge in a Shallow Trench Isolation Structure; Journal of the Korean Physical Society, vol. 41, No. 6, Dec. 2002, pp. 912-917.
Uchida, Y. et al.; Chemical-Vapor Deposition of OH-free and Low-k Organic-Silica Films; Jpn. J. Appl. Phys., vol. 37, pp. 6369-6373, Part 1, No. 12A, Dec. 1998.
Shirafuji, T. et al.; Plasma Enhanced Chemical Vapor Deposition of Fluorinated Amorphous Carbon Thin Films from Tetrafluoroethylene and Tetraisocyanatesilane; Plasmas and Polymers, vol. 3, No. 2, 1998.
Sugiura, O. et al.; Application of SiO2 Films deposited by TICS/O2 PECVD to InSb MISFET (Abstract); MRS Fall Meeting, 1998.
Idris, I. et al.; Hydrogen-Free Plasma-Enhanced Chemical Vapor Deposition of Silicon Dioxide Using Tetra-isocyanate-silane (Si(NCO)4); Jpn. J. Appl. Phys. vol. 34, pp. L772-L774, Jun. 15, 1995.
Sugiura, O.; Plasma-Enhanced Chemical Vapor Deposition of Hydrogen-Free SO_2 using tetra-isocyanate-silane (Abstract); FY1995 Final Research Report Summary, Tokyo Institute of Technology.
Taniguchi, H. et al.; Low-Temperature Chemical Vapor Deposition of Silicon Dioxide Using Tetra-isocyanate-silane (Si(NCO)4); Jpn. J. Appl. Phys., vol. 33, pp. L1485-L1488, Oct. 15, 1994.

* cited by examiner

HYDROGEN-FREE SILICON-BASED DEPOSITED DIELECTRIC FILMS FOR NANO DEVICE FABRICATION

FIELD OF THE INVENTION

The present invention relates generally to semiconductor fabrication, and more particularly, to hydrogen-free dielectric films and methods of fabrication.

BACKGROUND OF THE INVENTION

For a long time, silicon-based integrated circuits (IC)s have been fabricated using a silicon dielectric such as silicon oxide. These films are heretofore formed using various hydrogen-bearing precursors. These hydrogen-bearing precursors, are mostly in gas or liquid form and are widely used due to their ease of implementation into a chemical vapor deposition (CVD) process or a plasma enhanced CVD (PECVD) process. As a result, most of these dielectrics used in FEOL (front end of line) and BEOL (back end of line) silicon integrated circuit fabrication have a significant amount of weakly bonded hydrogen that can have a negative reliability impact to electronic devices, Furthermore, UV and E-Beam processing that have been recently implemented in sub-50 nm (for ULK curing or UV/E-beam lithography) devices can break the weak hydrogen bonds and release hydrogen atoms, and subsequently cause reliability issues. It is therefore desirable to have improvements in dielectric films to mitigate the aforementioned problems.

SUMMARY OF THE INVENTION

In a first aspect, embodiments of the present invention provide a method of forming a dielectric film comprising: introducing a substrate into a chamber of a deposition tool; heating the substrate at a process temperature; introducing a hydrogen-free precursor into said chamber of the deposition tool; and activating a plasma in the chamber.

In a second aspect, embodiments of the present invention provide a method of forming a multilayer dielectric film comprising: introducing a hydrogen-free precursor into a chamber of a deposition tool; introducing a first hydrogen-free reactive gas in said chamber; applying a first hydrogen-free plasma in the chamber to form a first sublayer; removing the first hydrogen-free plasma in the chamber; removing the first hydrogen-free reactive gas from the chamber; introducing a second hydrogen-free reactive gas in said chamber, different from the first hydrogen-free reactive gas; applying a second hydrogen-free plasma in the chamber to form a second sublayer; removing the second hydrogen-free plasma in the chamber; and removing the second hydrogen-free gas from the chamber.

In a third aspect, embodiments of the present invention provide a dielectric film comprising: a first sublayer; and a second sublayer disposed on the first sublayer, wherein the first sublayer and second sublayer are hydrogen-free silicon-containing sublayers.

In a fourth aspect, embodiments of the present invention provide a semiconductor structure, comprising: a semiconductor substrate; a gate dielectric layer disposed on the semiconductor substrate; a gate disposed on the gate dielectric layer; a self-aligned contact cap formed on the gate, wherein the wherein the self-aligned contact cap comprises a hydrogen-free dielectric film.

In a fifth aspect, embodiments of the present invention provide a semiconductor device comprising: an interconnect wiring structure comprising: a first layer of dielectric containing conductors embedded therein; a second layer of hydrogen-free dielectric comprising $SiC_xN_y$ and covering at least partially the surface of said first layer and containing conductor regions embedded therein; and a third layer of hydrogen free dielectric comprising $SiC_vN_w$ and covering at least partially the surface of said second layer and containing conductor regions embedded therein, wherein x is unequal to v and y is unequal to w.

BRIEF DESCRIPTION OF THE DRAWINGS

The structure, operation, and advantages of the present invention will become further apparent upon consideration of the following description taken in conjunction with the accompanying figures (FIGS.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Figure 1A:
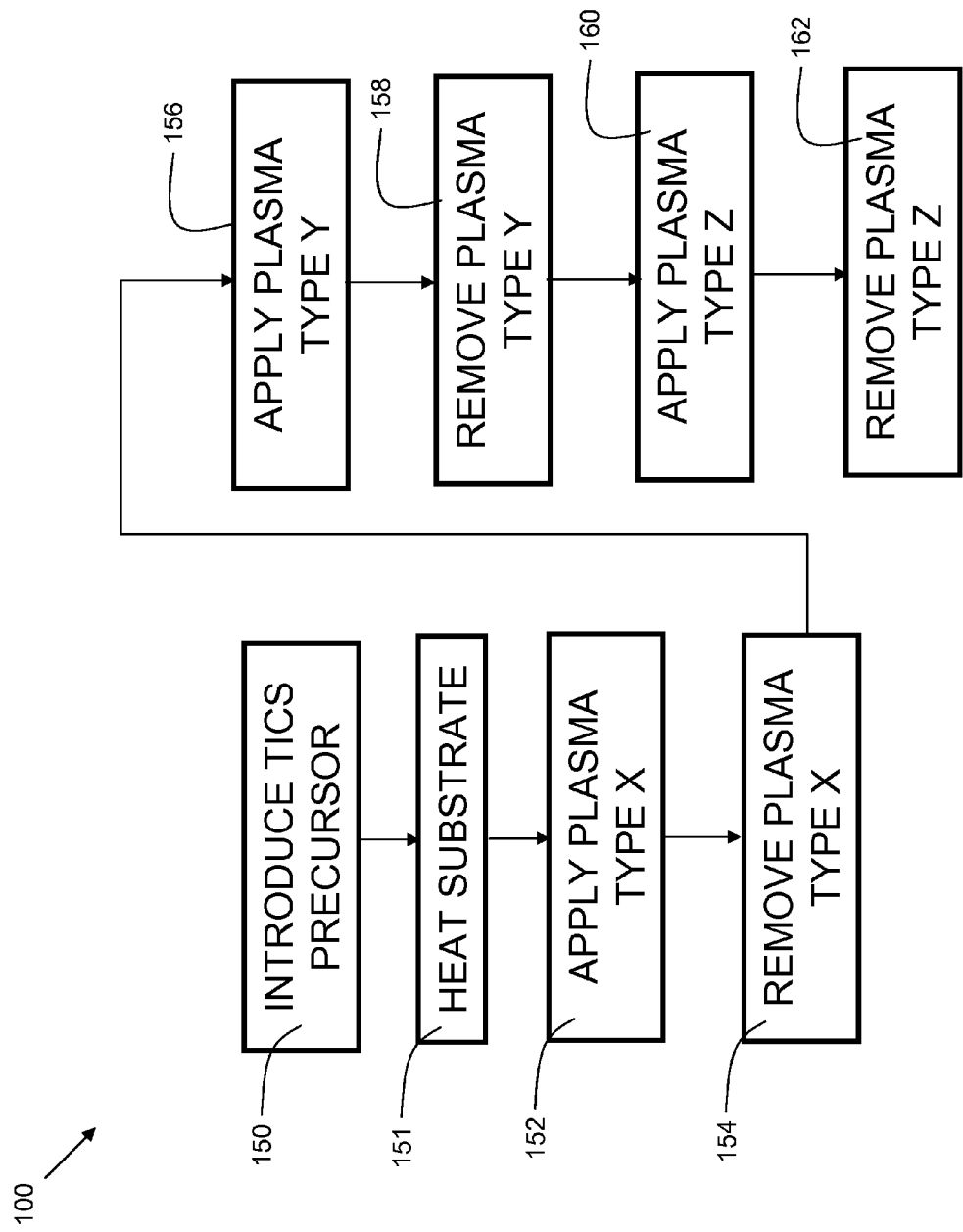

Often, similar elements may be referred to by similar numbers in various figures (FIGs) of the drawing, in which case typically the last two significant digits may be the same, the most significant digit being the number of the drawing figure (FIG). Furthermore, for clarity, some reference numbers may be omitted in certain drawings.

Figure 1B:
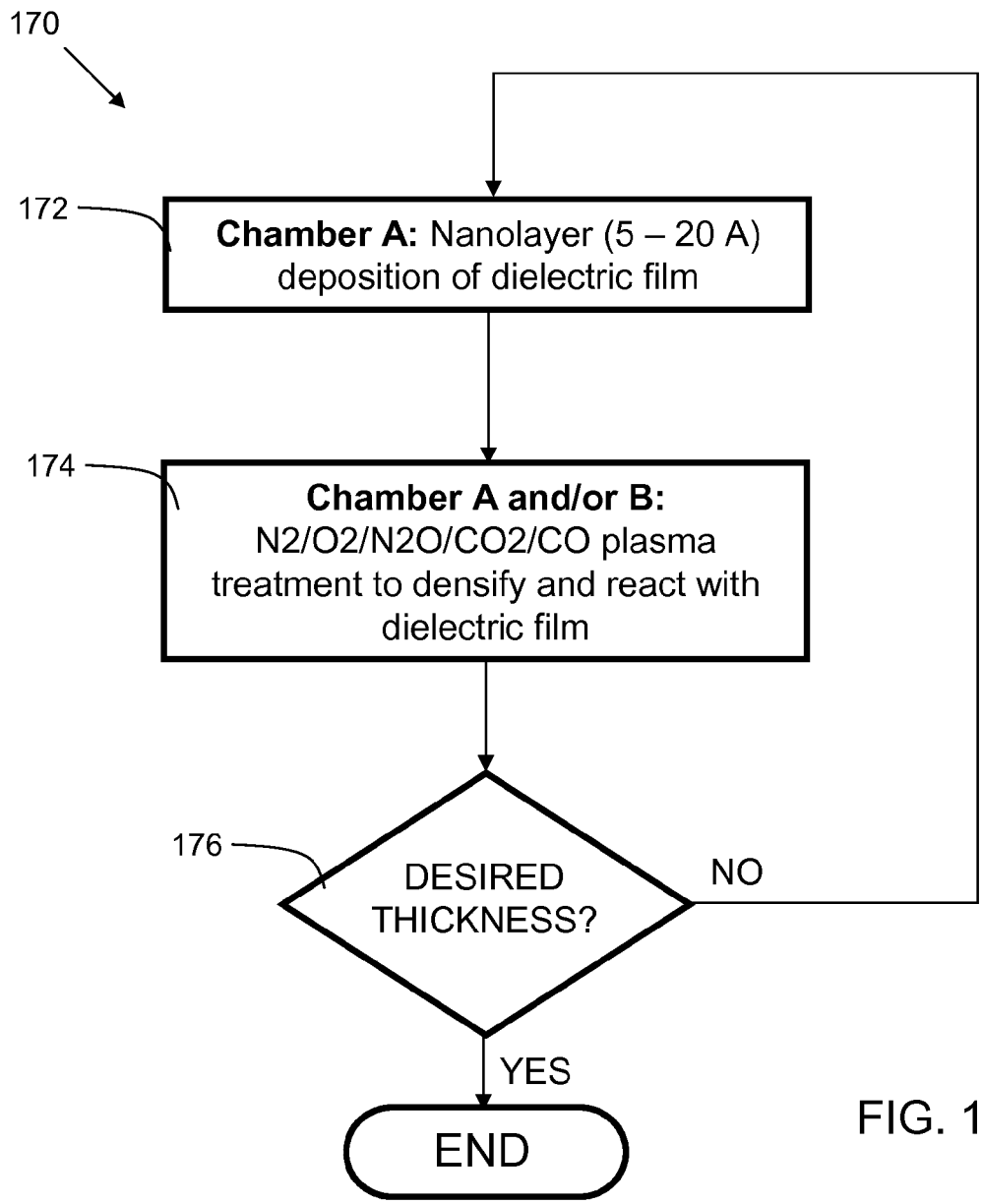

FIG. 1A and FIG. 1B are a flowcharts indicating process steps for embodiments of the present invention.

Figure 2A:
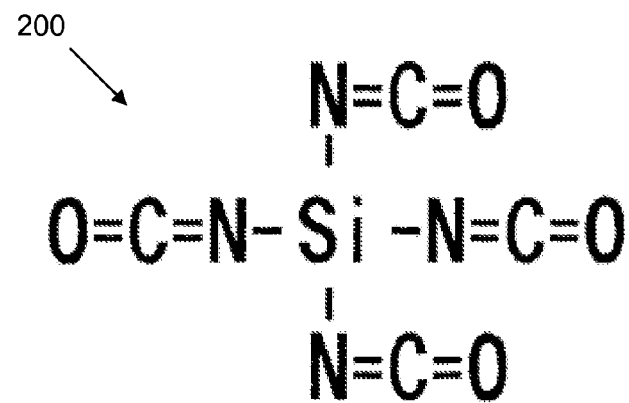

FIG. 2A shows a molecular structure diagram for a precursor used with embodiments of the present invention.

Figure 2B:
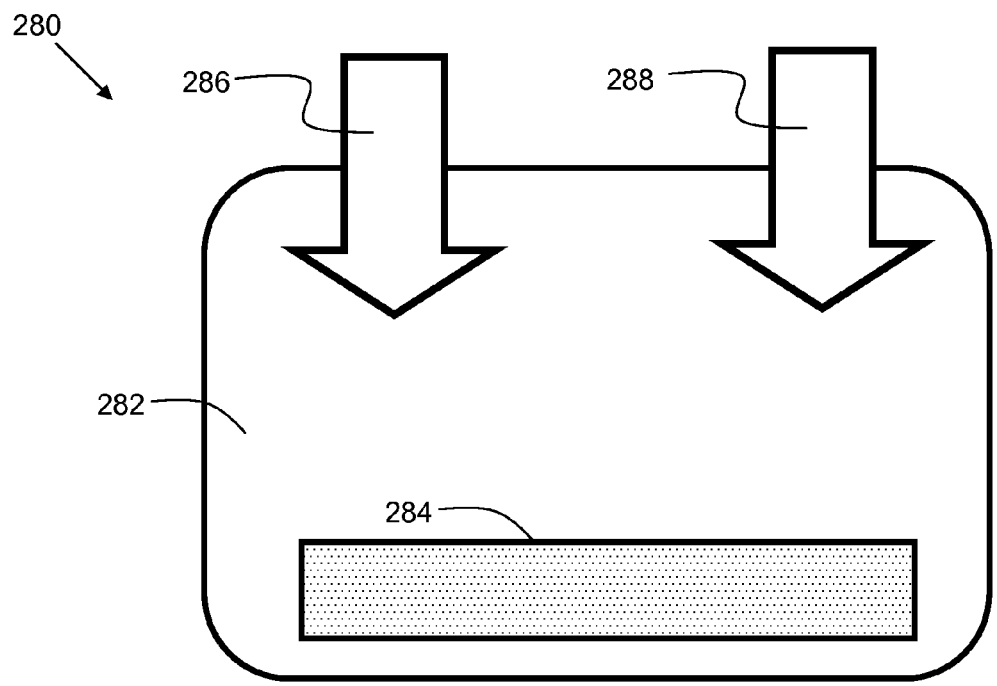

FIG. 2B shows precursors and a substrate in a process chamber in accordance with embodiments of the present invention.

Figure 3:
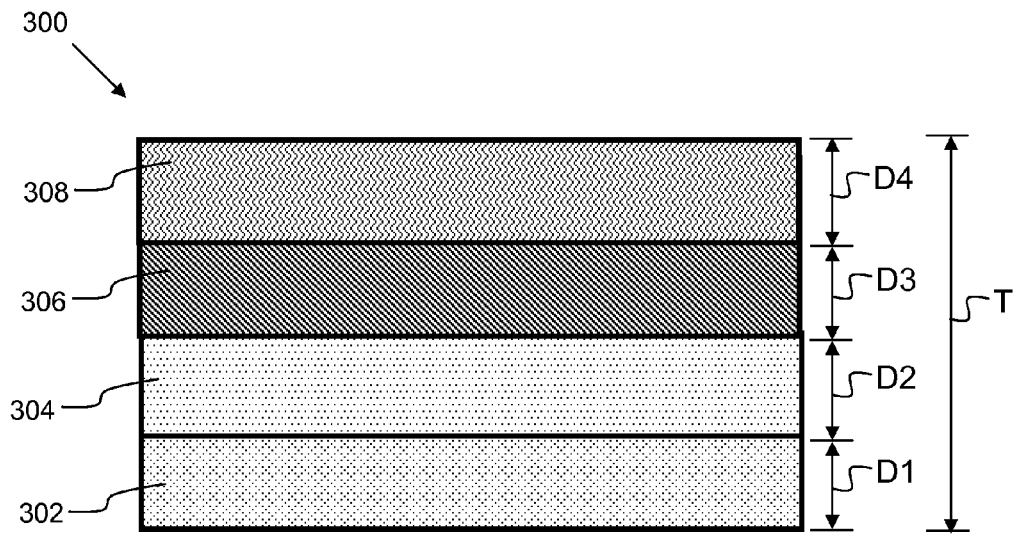

FIG. 3 shows a multilayer dielectric film in accordance with embodiments of the present invention.

Figure 4:
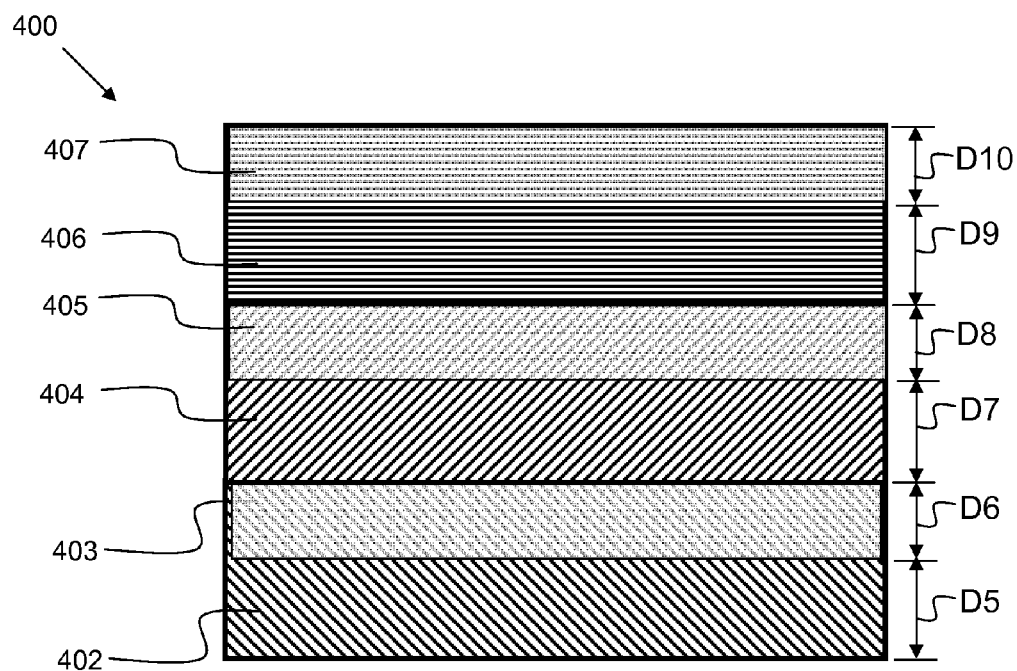

FIG. 4 shows a multilayer dielectric film in accordance with alternative embodiments of the present invention.

Figure 5:
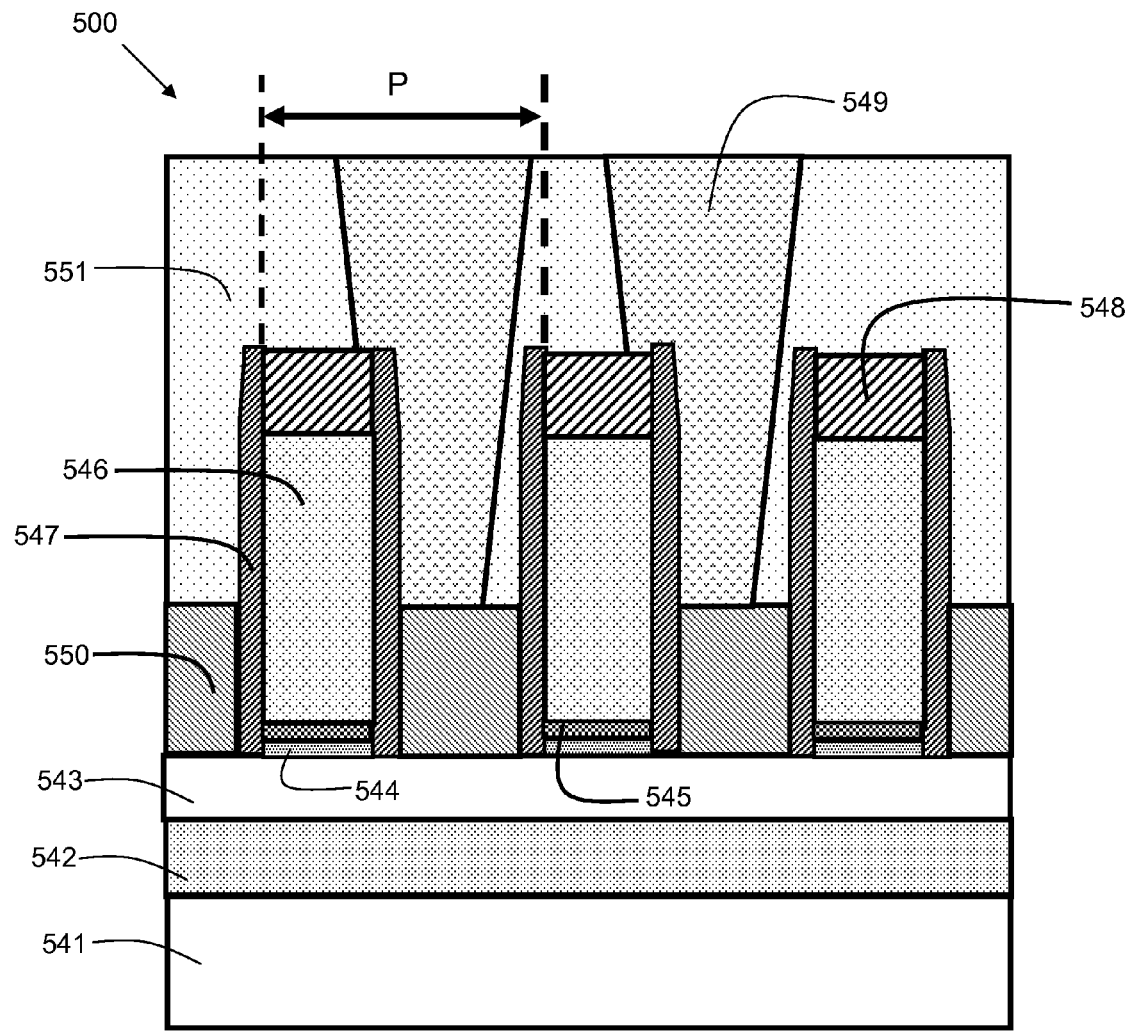

FIG. 5 shows a transistor gate structure using a multilayer dielectric film in accordance with embodiments of the present invention.

Figure 6:
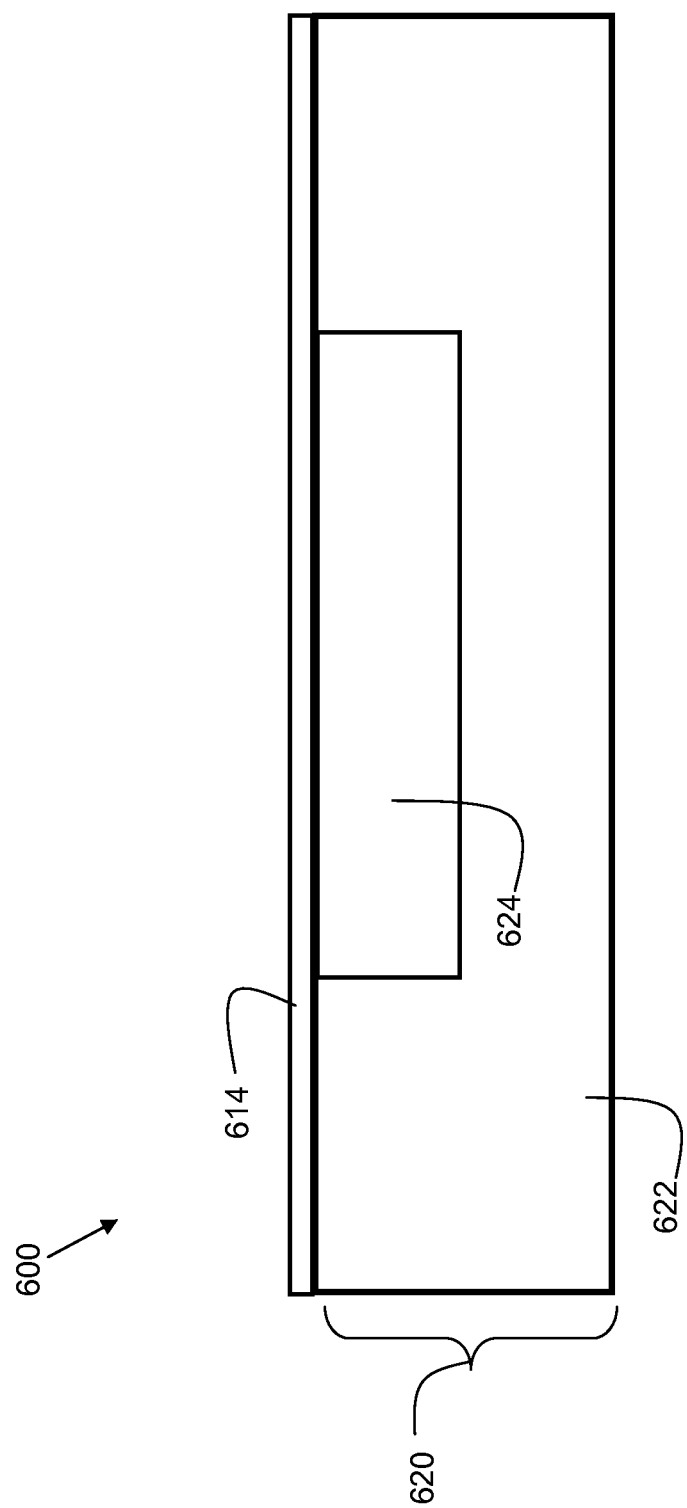

FIG. 6 shows a semiconductor structure which comprises a H-Free silicon dielectric film in accordance with additional embodiments of the present invention.

Figure 7:
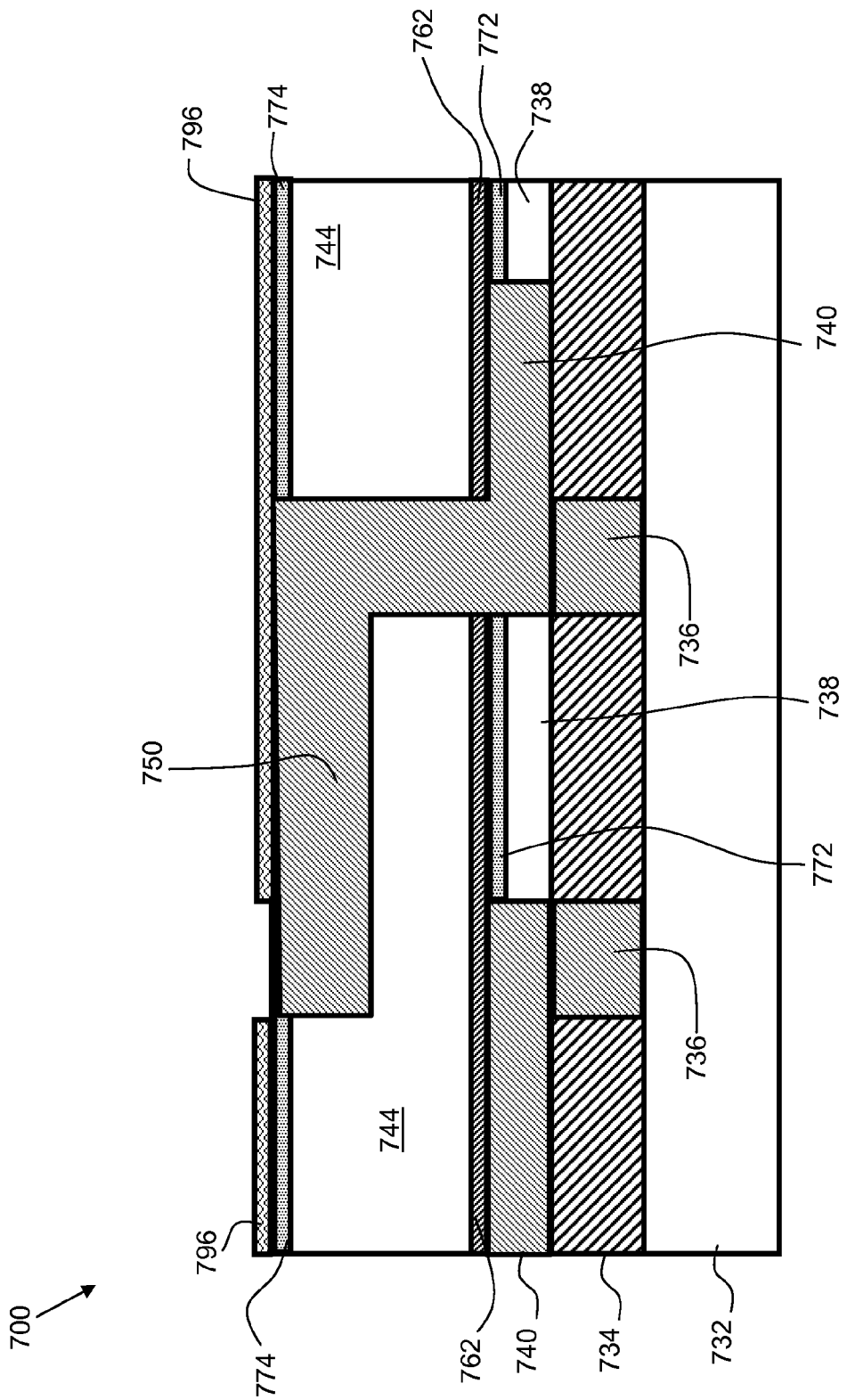

FIG. 7 illustrates yet another alternate electronic device utilizing a H-free silicon dielectric film in accordance with embodiments of the present invention.

Figure 8:
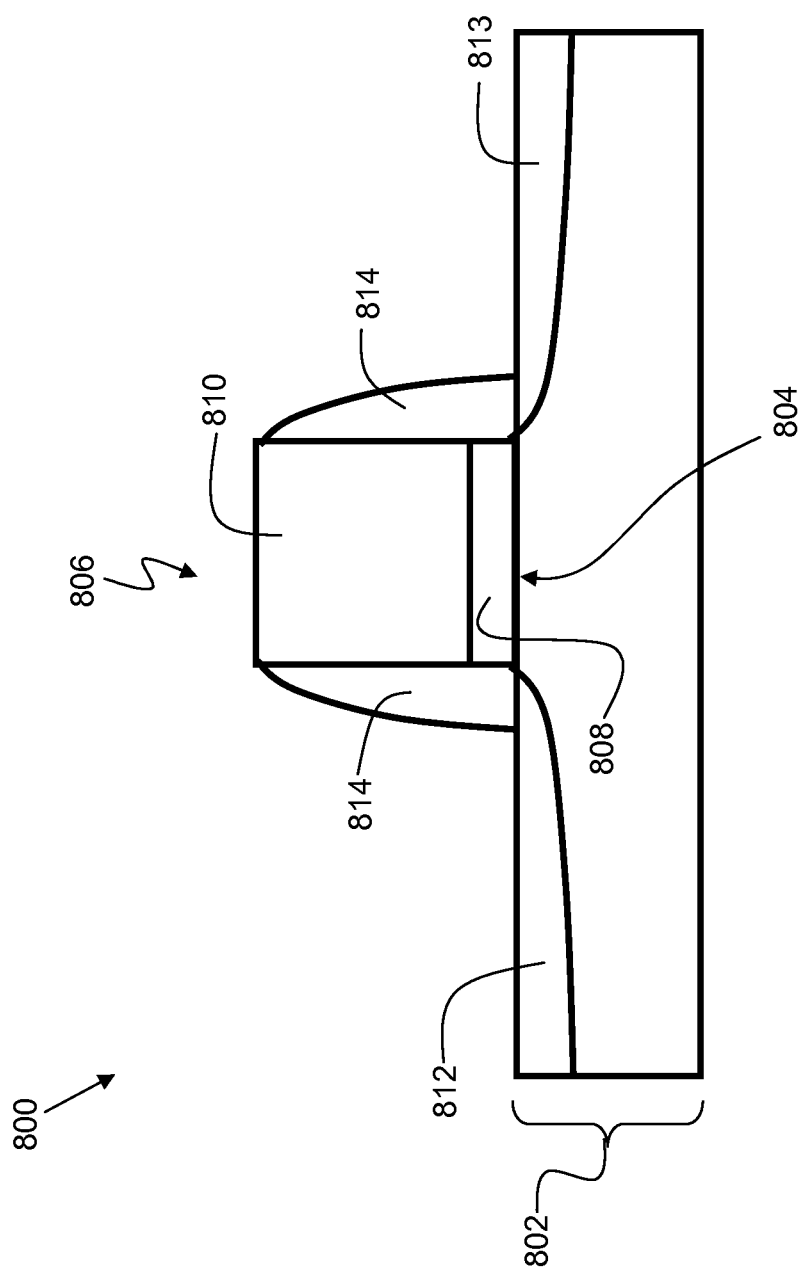

FIG. 8 illustrates yet another alternate electronic device utilizing a H-free silicon dielectric film in accordance with embodiments of the present invention.

Figure 9:
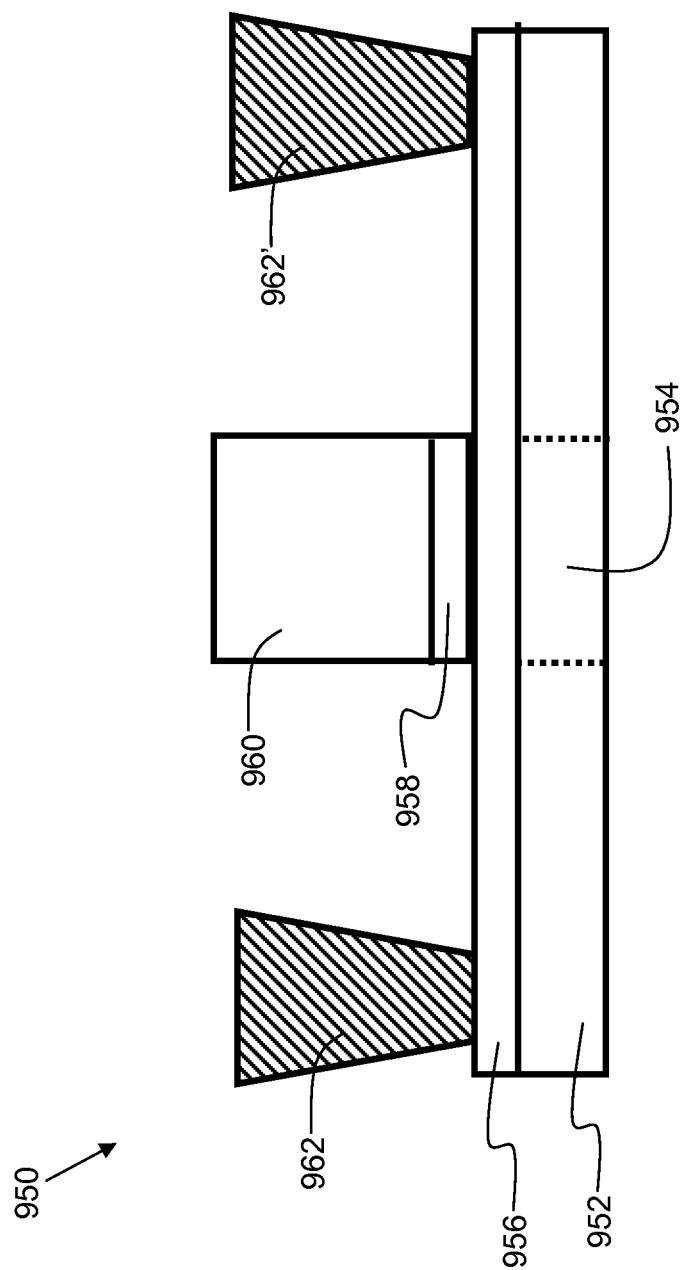

FIG. 9 illustrates yet another alternate electronic device utilizing a H-free silicon dielectric film in accordance with embodiments of the present invention.

Figure 10:
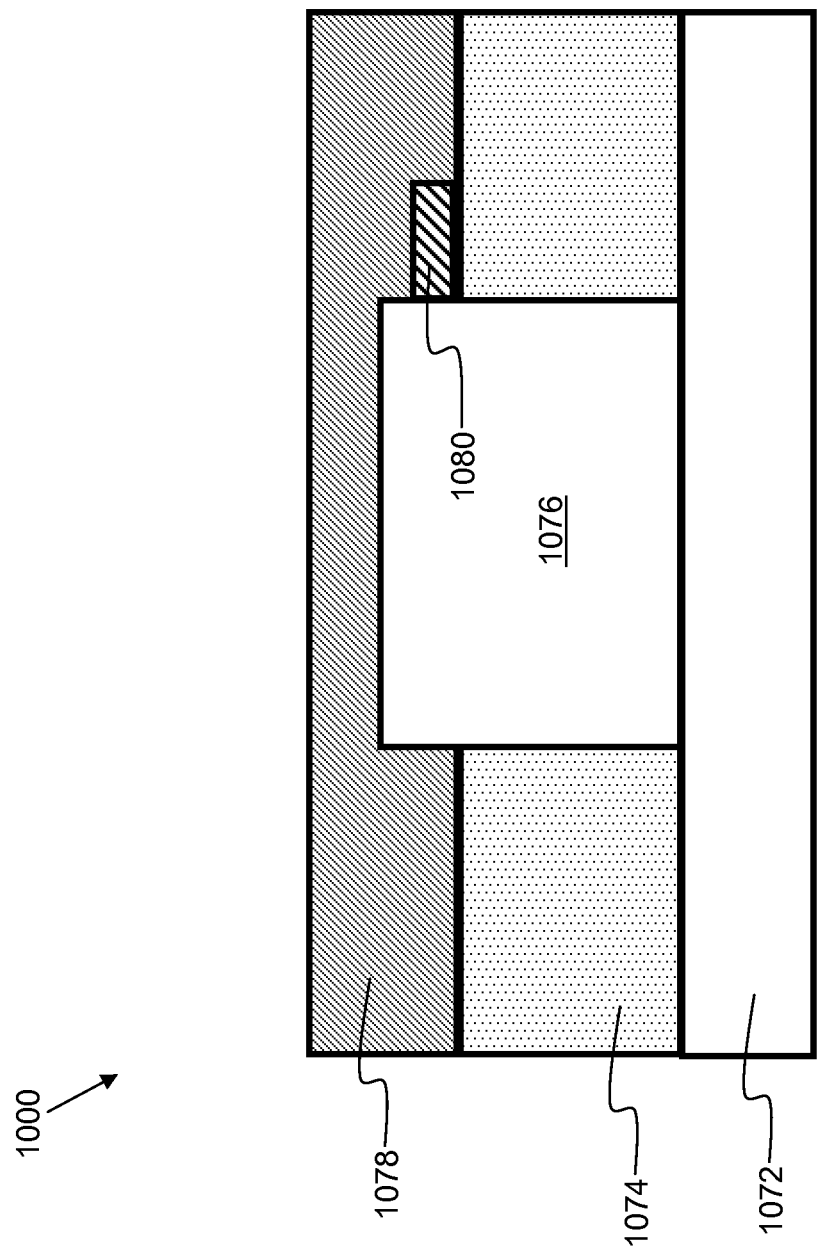

FIG. 10 illustrates a semiconductor structure that includes a MEMS device in accordance with embodiments of the present invention.

DETAILED DESCRIPTION

Embodiments of the present invention provide hydrogen-free dielectric films and methods of fabrication. A hydrogen-free precursor, such as tetraisocyanatosilane, and hydrogen-free reactants, such as nitrogen, oxygen ($O_2/O_3$) and nitrous oxide are used with chemical vapor deposition processes (PECVD, thermal CVD, SACVD, HDP CVD, and PE and Thermal ALD) to create hydrogen-free dielectric films. In some embodiments, there are multilayer dielectric films with sublayers of various materials such as silicon oxide, silicon nitride, and silicon oxynitride. In embodiments, the hydrogen-free reactants may include TICS, along with a hydrogen-free gas including, but not limited to, N2, O2, O3, N2O, CO2, CO and a combination thereof of these H-Free gases. Plasma may be used to enhance the reaction between the TICS and the other H-free gasses. The plasma may be controlled during film deposition to achieve variable density within each sublayer of the films.

FIG. 1A is a flowchart 100 indicating process steps for embodiments of the present invention. In process step 150, a hydrogen-free precursor, such as Tetra Isocyanato Silane (TICS) is introduced into a process chamber of a deposition tool. In process step 151, the substrate is heated to an elevated temperature in the chamber. In embodiments, the process temperature of the chamber may range from about 100 degrees Celsius to about 400 degrees Celsius. In process step 152, a plasma of a first type (generically referred to as "Type X") is applied for a duration (e.g. 5 seconds to 60 seconds). In process step 154, the plasma of type X is removed. In process step 156, a plasma of a second type (generically referred to as "Type Y") is applied for a duration (e.g. 5 seconds to 60 seconds). In process step 158, the plasma of type Y is removed. In process step 160, a plasma of a third type (generically referred to as "Type Z") is applied for a duration (e.g. 5 seconds to 60 seconds). In process step 162, the plasma of type Z is removed. In embodiments, the plasma types may include a TICS+oxygen plasma (O2), a TICS+nitrogen plasma (N2), a TICS+carbon dioxide plasma (CO2), and a TICS+nitrous oxide plasma (NO2). Each plasma (types X, Y, and Z) is a hydrogen-free plasma. The type of plasma applied determines the type of film that is deposited. For example, applying an O2 plasma with the TICS precursor results in an SiOx film being formed, such as silicon oxide. Note that the above plasma steps are exemplary and other embodiments of the present invention may utilize a different sequence of plasma steps to make film. In some cases there may be more or fewer plasma steps.

All films in accordance with embodiments of the present invention are hydrogen-free (H-free). The deposition process produces various H-Free films, including, but not limited to, SiOx, SiN, SiNxOy, SiNxOyCz dielectric films. Embodiments of the present invention may utilize a plasma enhanced chemical vapor deposition (PECVD). Other embodiments may use CVD, ALD and other thermal/UV assisted CVD processes.

The table below lists some of the films formed by embodiments of the present invention. In the reactions listed below, the first reactant is typical H-Free Si(NCO)4, i.e. (TICS), and the second reactant is also an H-Free gas, and may include N2, O2, O3, N2O, CO2, CO and a combination thereof of these H-Free gases.

| Example Reactions |
| --- |
| Si(NCO)4 + N2 (down stream or direct plasma) → SiNx (excess activated N2 plasma) |
| Si(NCO)4 + N2 (down stream or direct plasma) → SiOxCyNz (low amount of N2 flow in plasma) |
| Si(NCO)4 + O2 (down stream or direct plasma) → SiOx (excess O2 plasma) |
| Si(NCO)4 + N2 + O2 (down stream or direct plasma) → SiNxCyOz (controlled N2/O2 ratio) |
| Si(NCO)4 + CO2 (down stream or direct plasma) → SiOx (or SiNOx or SiNOxCy, amount of C is relatively small depending on CO2 and plasma → condition) |
| Si(NCO)4 + CO (down stream or direct plasma) → SiOxNyCz (or SiNSiOCN using a low amount of N2 flow in Plasma) |
| Si(NCO)4 + O2 (down stream O2/O3 or direct plasma → SiOx (excess O2) and Si(NCO)4 only |
| Si(NCO)4 (down stream or direct plasma) → SiOx (or SiNxCyOz at low plasma power at low temperature) |

The steps of applying and removing plasma (e.g. steps 160 and 162) may be performed multiple times to produce multilayer dielectric films of many sublayers. While three plasma applications are shown in the flowchart 100, in practice, many more cycles may be performed, such that films with hundreds of sublayers may be formed. In some embodiments, alternating sublayers may be used. For example, a sublayer of silicon oxide may be formed, followed by a sublayer of silicon nitride, followed by another sublayer of silicon oxide. In such a case, plasma type X and plasma type Z may be equivalent (e.g. O2 plasma).

FIG. 1B is a flowchart 170 showing process steps as they may be related to a particular process chamber of a deposition tool. In some embodiments, the entire film may be formed in a single process chamber. In other embodiments, multiple process chambers may be used. In process step 172, a nanolayer of a dielectric film (e.g. SiOx, SiN, SiNxOy, SiNxOyCz) is deposited on a substrate (as described and shown in FIG. 1). In embodiments, the film thickness may range from about 5 angstroms to about 20 angstroms. In process step 174, a plasma treatment is applied to densify and react with the dielectric film. In process step 176, a check is made to determine if the film is of a desired thickness for a given application. If yes, the process ends. If no, the process steps of 172 and 174 repeat until the desired thickness level is reached. Hence, some embodiments may utilize one deposition and plasma treatment cycle, while other embodiments may utilize multiple cycles. The process steps 172 to 174 can be repeated many times (e.g. 100-150 times) to make thicker films.

FIG. 2A shows a molecular structure diagram 200 for a precursor used with embodiments of the present invention. The precursor shown in FIG. 2A is tetraisocyanatosilane (TICS), also referred to as Si(NCO)4. Other hydrogen-free precursors are contemplated, and within the scope of embodiments of the present invention.

FIG. 2B shows a block diagram of deposition system 280 comprising a deposition process chamber 282. In embodiments, the process chamber 282 may be part of a deposition tool such as a chemical vapor deposition (CVD) tool, including, but not limited to, plasma enhanced CVD (PECVD), thermal CVD, sub-atmospheric CVD (SACVD), high density plasma CVD, and atomic layer deposition (ALD). A first precursor 286 and a second precursor 288 are introduced into the process chamber 282 in accordance with embodiments of the present invention, and cause a film to be formed on substrate 284. Plasma may then be activated in the process chamber 282 to enhance the reaction between the precursors. In embodiments, substrate 284 is a semiconductor substrate, having a surface which may include regions of semiconductors and/or regions of conductors separated by regions of dielectric insulators. Both the first precursor 286 and the second precursor 288 are hydrogen-free. In embodiments, the first precursor 286 is comprised of tetraisocyanatosilane (TICS), also referred to as Si(NCO)4.

In embodiments, the precursor 286 is introduced to the chamber at a total gas flow rate ranging from about 30 sccm to about 350 sccm (standard cubic centimeters per minute). In embodiments, the substrate 282 may be heated at a process temperature ranging from about 100 degrees Celsius to about 400 degrees Celsius. In embodiments, the second precursor 288 may include, but is not limited to, N2, O2, O3, N2O, CO2, CO and a combination of these H-Free gases. In addition to the hydrogen-free precursors, additional inert gases may be introduced into the chamber 282, including, but not limited to, argon and/or helium.

FIG. 3 shows a multilayer dielectric film 300 in accordance with embodiments of the present invention. Multilayer dielectric film 300 is comprised of a first sublayer having a thickness D1, a second sublayer having a thickness D2, a third sublayer having a thickness D3, and a fourth sublayer having a thickness D4. Note that while four sublayers are shown in FIG. 3, embodiments may have more or fewer sublayers. In embodiments, the thickness D1 may range from about 4 angstroms to about 12 angstroms. In other embodiments, the thickness D1 may range from about 4 angstroms to about 10 angstroms. In still other embodiments, the thickness D1 may range from about 5 angstroms to about 8 angstroms. In embodiments, the other thicknesses (D2–D4) may have a thickness in the same range as thickness D1. However, the thicknesses D1–D4 may not necessarily be equal to each other. Hence, the total thickness T of the dielectric film 300 may range from about 16 angstroms to about 48 angstroms. In embodiments, the sublayers 302, 304, 306, and 308 may be comprised of different materials, or alternating materials. The tables below illustrate some example embodiments:

| Sublayer | Material |
|---|---|
| Embodiment #1 | |
| 302 | Silicon oxide |
| 304 | Silicon nitride |
| 306 | Silicon oxide |
| 308 | Silicon nitride |
| Embodiment #2 | |
| 302 | Silicon nitride |
| 304 | Silicon oxide |
| 306 | Silicon nitride |
| 308 | Silicon oxide |
| Embodiment #3 | |
| 302 | Silicon nitride |
| 304 | Silicon oxide |
| 306 | SiN$x$O$y$ |
| 308 | SiCNO$x$ |
| Embodiment #4 | |
| 302 | Silicon oxide |
| 304 | SiCN$x$ |
| 306 | SiCNO$x$ |
| 308 | SiN$x$ |
| Embodiment #5 | |
| 302 | SiCNO$x$ |
| 304 | SiO$x$ |
| 306 | SiCNO$x$ |
| 308 | SiO$x$ |

In some embodiments, the second sublayer 304 comprises a composition of SiC$x$N$y$, and the third sublayer 306 comprises a composition of SiC$v$N$w$, wherein x, y, v, and w are variables pertaining to the concentrations of constituent elements, and wherein x is unequal to v and y is unequal to w. In some embodiments, x ranges from 0 to about 1.0 and y ranges from about 0.3 to about 1.4. In some embodiments, v ranges from about 1.0 to about 2.0 and w ranges from 0 to about 0.3. In some embodiments, x ranges from about 0.3 to about 1.0 and y ranges from about 0.3 to about 1.4. In some embodiments, v ranges from about 1.0 to about 2.0 and w ranges from about 0.1 to about 0.3. Other embodiments are possible and within the scope of embodiments of the present invention.

FIG. 4 shows a hydrogen-free multilayer dielectric film 400 in accordance with alternative embodiments of the present invention. In this embodiment, there are three sublayers, 402, 404, and 406. During the formation of each sublayer, the plasma power is increased near the completion of the deposition of the sublayer, resulting in a region of increased film density for each sublayer disposed on the upper portion of each sublayer. The dense region can serve to increase film stability and prevent damage due to outgassing and other effects. For sublayer 402, the dense region is indicated by reference 403. Sublayer 402 has a thickness of D5+D6, where the thickness D6 represents the thickness of the increased density region 403 and the thickness D5 represents the region of less density. In embodiments, the thickness D5 may range from about 3 angstroms to about 8 angstroms, and the thickness D6 may range from about 3 angstroms to about 5 angstroms. For sublayer 404, the dense region is indicated by reference 405. Sublayer 404 has a thickness of D7+D8, where the thickness D8 represents the thickness of the increased density region 405 and the thickness D7 represents the region of less density. In embodiments, the thickness D7 may range from about 3 angstroms to about 8 angstroms, and the thickness D8 may range from about 3 angstroms to about 5 angstroms. For sublayer 406, the dense region is indicated by reference 407. Sublayer 406 has a thickness of D9+D10, where the thickness D10 represents the thickness of the increased density region 407 and the thickness D9 represents the region of less density. In embodiments, the thickness D9 may range from about 3 angstroms to about 8 angstroms, and the thickness D10 may range from about 3 angstroms to about 5 angstroms.

In embodiments, the sublayers 402, 404, and 406 may be comprised of different materials, or alternating materials. The tables below illustrate some example embodiments:

| Sublayer | Material |
|---|---|
| Embodiment #1 | |
| 402 | Silicon oxide |
| 404 | Silicon nitride |
| 406 | Silicon oxide |
| Embodiment #2 | |
| 402 | Silicon nitride |
| 404 | Silicon oxide |
| 406 | Silicon nitride |
| Embodiment #3 | |
| 402 | SiCNO$x$ |
| 404 | Silicon oxide |
| 406 | Silicon nitride |
| Embodiment #4 | |
| 402 | SiN$x$O$y$ |
| 404 | SiCNO$x$ |
| 406 | Silicon oxide |
| Embodiment #5 | |
| 402 | SiCNO$x$ |
| 404 | Silicon nitride |
| 406 | SiCNO$x$ |

Other embodiments are possible and within the scope of embodiments of the present invention.

FIG. 5 is a semiconductor structure 500 in accordance with embodiments of the present invention. Semiconductor structure 500 comprises semiconductor structure 541. In embodiments, semiconductor substrate 541 may comprise a silicon substrate. A buried oxide (BOX) layer 542 is disposed on the semiconductor substrate 541. In embodiments, the BOX layer 542 is comprised of silicon oxide. A semiconductor-on-insulator (SOI) layer 543 is disposed on the BOX layer 542. In embodiments, the SOI layer 543 is comprised of silicon. In other embodiments, the layer 543 may be comprised of silicon germanium (SGOI). Note that while structure 500 shows a SOI structure, embodiments of the present invention may also comprise a bulk structure, where BOX layer 542 and SOI layer 543 are not present. Semiconductor structure 500 further comprises regions of gate dielectric 544. In embodiments, the regions of gate dielectric 544 may include, but are not limited to, HfOx, HfSiOx, ZrOx, ZrSiOx, and AlOx. A gate electrode 546 is disposed above each region of gate dielectric 544. The gate electrodes 546 have a pitch P which defines the distance between two neighboring gates. In embodiments, the pitch P ranges from about 40 nanometers to about 70 nanometers. In some embodiments, the gate electrode 546 is comprised of doped polysilicon. In other embodiments, the gate dielectric is comprised of metal, and may be formed using a replacement metal gate (RMG) process. In such embodiments, the metal may include, but is not limited to, tungsten and/or aluminum. Work function metal layer 545 may be disposed between the gate dielectric 544 and the gate electrode 546. The work function layer 545 may be used to tune the threshold voltage of the transistors. In embodiments, the work function layer material may include, but is not limited to, LaOx and AlOx for nFET and pFET devices. Offset spacers 547 are disposed adjacent to the gate electrodes 546. In embodiments, offset spacers 547 are comprised of multilayer H-free films in accordance with embodiments of the present invention. The use of such a H-free film can significantly improve wet etch resistance of the spacer film during downstream processing. In embodiments, the offset spacers 547 are formed using an atomic layer deposition (ALD) process. In embodiments, the offset spacers 547 are conformally deposited, and have a dielectric constant k between 3 and 7. A protective dielectric cap 548 is disposed above the gate electrode 546. In embodiments, the dielectric cap 548 is comprised of a H-free film including, but not limited to, a nitride (SiN), oxynitride (SiON), oxycarbonitride (SiOCN), and/or oxycarbide (SiOC) of silicon. The dielectric cap 548 provides an important function in cases where the pitch P is less than 70 nanometers. In such cases, meeting overlay tolerances can be challenging, resulting in an increased chance of mis-landed Source/Drain contacts on top of the gates. This could potentially cause gate-to S/D shorts. The cap 548 serves to prevent metal contacts from shorting to the gate. Metal contacts 549 are formed to make contact to source/drain regions 550. In embodiments, source/drain regions 550 are raised source/drain (RSD) regions that may be formed of a metal silicide. Metal contacts 549 may be comprised of any suitable conductor material, including, but not limited to, tungsten, aluminum and/or copper. An interlevel dielectric (ILD) 551 is disposed over the structure 500. In embodiments, ILD 551 may include, but is not limited to, SiO2, F doped SiO2, and SiOCH.

FIG. 6 shows a semiconductor structure 600 which comprises a H-Free silicon dielectric (single or multilayer) SiN, SiNO, SiOx, SiCN, SiCNO film 614 that is formed atop a surface of an interconnect structure 620. The interconnect structure 620 includes an interconnect dielectric material 622 having at least one conductive material 624 embedded therein. The interconnect structure 620 can be formed utilizing conventional processing steps well known to those skilled in the art. For example, a single damascene or a dual damascene process can be employed. In this particular embodiment, the H-Free silicon dielectric (single or multilayer) SiN, SiNO, SiOx, SiCN, SiCNO film 614 serves as a dielectric cap for the interconnect structure 620. In some embodiments of the present disclosure, the H-Free silicon dielectric (single or multilayer) SiN, SiNO, SiOx, SiCN, SiCNO 614 completely covers the entire top surface of the interconnect structure 620. In another embodiment, the H-Free silicon dielectric (single or multilayer) SiN, SiNO, SiOx, SiCN, SiCNO film 614 only is located atop the at least one conductive material 624. In yet another embodiment, the H-Free silicon dielectric (single or multilayer) SiN, SiNO, SiOx, SiCN, SiCNO film partially covers the at least one conductive material 624 and partially, or completely covers the interconnect dielectric material 622.

FIG. 7 illustrates yet another alternate electronic device 700. On top of the substrate 732, a first layer of an interconnect dielectric material 734 is first formed with a first region of conductive material 736 embedded therein. After a CMP process is conducted on the first region of conductive material 736, a second layer of interconnect dielectric material 738 is formed on top of the first layer of interconnect dielectric material 734 and the first region of conductive material 736. The second layer of interconnect dielectric material 738 is then patterned in a photolithography process followed by etching and a conductor layer 740 (which may be the same or different material as the first conductor layer 736) is deposited thereon. After a CMP process on the conductor layer 740 is carried out, a third layer of an interconnect dielectric material 744 (which may be the same or different dielectric material than the first and second interconnect dielectric layers) is formed overlying the second layer of interconnect dielectric material 738 and the conductor layer 740. The conductor layer 740 is in electrical communication with the first region of conductive material 736.

A second region of conductive material 750 is then formed after a photolithographic process on the third layer of interconnect dielectric material 744 is conducted followed by etching and then a deposition process for a second conductor material. The second region of conductive material 750 serves as an interconnect wiring level, and may be one of the materials mentioned above for conductive material 624 (see FIG. 6). The second region of conductive material 750 is in electrical communication with the first region of conductive material 740 and is embedded in the third layer of the interconnect dielectric material 744. The third layer of interconnect dielectric material 744 is in intimate contact with the second layer of interconnect dielectric material 738, which, in some embodiments can be composed of the H-Free silicon dielectric (single or multilayer) SiN, SiNO, SiOx, SiCN, SiCNO film of the present disclosure.

A dielectric cap layer 762 is deposited between the second layer of interconnect dielectric material 738 and the third layer of interconnect dielectric material 744. The dielectric cap layer 762 can be comprised of the H-Free silicon dielectric (single or multilayer) SiN, SiNO, SiOx, SiCN, SiCNO film of the present disclosure. The dielectric cap layer 762 functions as a diffusion barrier layer for preventing diffusion of the first conductor layer 740 into the third layer of interconnect material 744 or into the lower layers, especially into layers 734 and 732.

Two additional dielectric cap layers 772 and 774 which act as a RIE mask and CMP (chemical mechanical polishing) polish stop layer are used. The first dielectric cap layer 772 is deposited on top of the second layer of interconnect dielectric material 738 and is used as an RIE mask and CMP stop, so the first conductor layer 740 and layer 772 are approximately co-planar after CMP. The function of the second dielectric cap layer 774 is similar to layer 772, however layer 774 is utilized in planarizing the second conductor layer 750. The polish stop layer 774 can be deposited of a suitable dielectric material such as silicon oxide, silicon nitride, silicon oxynitride, silicon carbide, silicon carbo-oxide (SiCO), Silicon Carbo-oxynitride (SiCON), or their hydrogenated compounds. Alternatively, the H-Free silicon dielectric (single or multilayer) SiN, SiNO, SiOx, SiCN, SiCNO dielectric film of the present disclosure can be used as the material for polish stop layer 774.

An additional diffusion barrier layer 796 (which may be comprised of the H-Free silicon dielectric (single or multilayer) SiN, SiNO, SiOx, SiCN, SiCNO dielectric film of the present disclosure) is further deposited on top of the upper dielectric layer 774.

In one embodiment, the layer 744 of dielectric material can include the H-Free silicon dielectric (single or multilayer) SiN, SiNO, SiOx, SiCN, SiCNO dielectric film of the present disclosure. An additional diffusion barrier layer 796 (which may be comprised of the H-Free silicon dielectric (single or multilayer) SiN, SiNO, SiOx, SiCN, SiCNO dielectric film of the present disclosure) is further deposited on top of the upper dielectric layer 774.

FIG. 8 illustrates an electronic device 800 including a H-Free silicon dielectric (single or multilayer) SiN, SiNO, SiOx, SiCN, SiCNO spacer 814. In this embodiment of the present disclosure, the electronic device 800 can fabricated using any conventional FET process flow, including a replacement gate process. In some embodiments the FET process that can be used includes deposition of the various material layers, lithography and etching.

The following discussion of planar device geometry for spacer application is for illustrative purposes only and, as such, the present disclosure is not limited to planar device architecture. Instead, the H-Free silicon dielectric (single or multilayer) SiN, SiNO, SiOx, SiCN, SiCNO spacer can be used in 3D device architectures such as, for example, finFET, trigate, double gate, and Si nanowire devices as well.

The electronic device 800 includes a semiconductor substrate 802 including one of the semiconductor materials mentioned above. A portion of the semiconductor substrate 802, that is located beneath gate stack 806, defines a channel region 804 of the device. The gate stack 806 includes at least one gate dielectric material 808 and a gate conductor 810 located thereon. At the footprint of the gate stack 808 and located in the semiconductor substrate 802 there is a source region 812 and a drain region 813. The source region 812 and the drain region 813 are connected via the channel region 804.

The at least one gate dielectric material 808 includes an oxide, a nitride, an oxynitride or a multilayered stack thereof. In one embodiment, the at least one gate dielectric material 808 includes a semiconductor oxide, a semiconductor nitride or a semiconductor oxynitride. In another embodiment, the at least one gate dielectric material 808 includes a dielectric metal oxide or mixed metal oxide having a dielectric constant that is greater than the dielectric constant of silicon oxide, e.g., 3.9. Typically, one of the dielectrics of the at least one gate dielectric material 808 has a dielectric constant greater than 4.0, with a dielectric constant of greater than 8.0 being more typical. Such dielectric materials are referred to herein as a high k dielectric. Exemplary high k dielectrics include, but are not limited to $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Multilayered stacks of these high k materials can also be employed as the at least one gate dielectric material 808. Each value of x is independently from 0.5 to 3 and each value of y is independently from 0 to 2. The thickness of the at least one gate dielectric material 808 is typically from 1 nm to 10 nm, with a thickness from 2 nm to 5 nm being more typical.

The gate conductor 810 includes a conductive material such as, but not limited to, polycrystalline silicon, polycrystalline silicon germanium, an elemental metal, (e.g., tungsten, titanium, tantalum, aluminum, nickel, ruthenium, palladium and platinum), an alloy of at least one elemental metal, an elemental metal nitride (e.g., tungsten nitride, aluminum nitride, and titanium nitride), an elemental metal silicide (e.g., tungsten silicide, nickel silicide, and titanium silicide) and multilayered combinations thereof. In one embodiment, the conductive material that can be employed as gate conductor 810 can be comprised of an nFET metal gate. In another embodiment, the conductive material that can be employed as gate conductor 810 can be comprised of a pFET metal gate. In a further embodiment, the conductive material that can be employed as gate conductor 810 can be comprised of polycrystalline silicon. The polysilicon conductive material can be used alone, or in conjunction with another conductive material such as, for example, a metal conductive material and/or a metal silicide material. The gate conductor 810 typically has a thickness from 1 nm to 100 nm, with a thickness from 3 nm to 30 nm being even more typical.

As shown in FIG. 8, a H-Free silicon dielectric (single or multilayer) SiN, SiNO, SiOx, SiCN, SiCNO spacer 814 is located on sidewalls of the gate stack 806. In this embodiment of the present disclosure, the H-Free silicon dielectric (single or multilayer) SiN, SiNO, SiOx, SiCN, SiCNO spacer 814 is formed by first depositing a H-Free silicon dielectric (single or multilayer) SiN, SiNO, SiOx, SiCN, SiCNO film as described above on the structure and then etching the film so as to form spacer 814 on the sidewalls of the gate stack 806. The presence of the H-Free silicon dielectric (single or multilayer) SiN, SiNO, SiOx, SiCN, SiCNO spacer 814 of the present disclosure on the sidewalls of the gate stack 806 reduces the parasitic capacitance in the FET device. The multilayer cyclic PECVD process for the H-Free silicon dielectric (single or multilayer) SiN, SiNO, SiOx, SiCN, SiCNO films described herein can enable excellent step coverage with low microloading and the hydrophobic nature of the H-Free silicon dielectric (single or multilayer) SiN, SiNO, SiOx, SiCN, SiCNO films produces good wet etch resistance much desired in spacer applications.

FIG. 9 shows an electronic device 950 that can be fabricated using any conventional FET process flow, including a replacement gate process. In some embodiments the FET process that can be used includes deposition of the various material layers, lithography and etching.

In particular, FIG. 9 illustrates an electronic device 950 that includes a silicon-based material as a substrate 952, wherein a portion of the silicon-based material defines a device channel 954. At least one layer of an interfacial dielectric material 956 is located on an upper surface of the device channel 954. The interfacial dielectric material 956 includes the H-Free silicon dielectric (single or multilayer) SiN, SiNO, SiOx, SiCN, SiCNO film of the present disclosure. At least one layer of a dielectric material 958 is located on an uppermost surface of the at least one layer of interfacial dielectric material 956, and at least one layer of a conductive material 960 is located on an uppermost surface of the at least one layer of dielectric material 958. It is noted that the dielectric material 958 and the conductive material 960 mentioned within this particular embodiment of the present disclosure are composed of one of the dielectric materials and conductive materials mentioned above for the at least one gate dielectric material 544 and the gate electrode 546 in FIG. 5. The electronic device 950 shown in FIG. 6A further includes at least two regions 962, 962' that make electrical contact to portions of the silicon-based material 952 that are adjacent to the device channel 954. The two regions 962, 962' are the source/drain regions of the electronic device 950 and they include one of the conductive materials mentioned above for the gate conductor 810 (FIG. 8). In one embodiment, the at least two regions 962, 962' are composed of graphene or silicon based materials. The at least two regions 962, 962' are formed by deposition, lithography and etching. In one embodiment (not shown), the at least two regions 962, 962' are in direct contact with the silicon-based material 952. Such a device is achieved by removing portions of the at least one layer of interfacial dielectric material 956 by etching. In another embodiment, the at least two regions 962, 962' are in direct contact with a portion of the at least one layer of interfacial dielectric material 956. In electronic structure 950, the interfacial dielectric material 952 has a high affinity for bonding with the underlying silicon-based material 952.

FIG. 10 illustrates a semiconductor structure 1000 having a semiconductor integrated circuit 1074 that is formed on a semiconductor substrate 1072 and includes a MEMS device 1076. In embodiments, the substrate 1072 is a silicon wafer. An interconnection structure 1080 may include a conductive polysilicon interconnect between the MEMS 1076 and the integrated circuit 1074. The integrated circuit 1074 may include any combination of transistors, diodes, and additional layers of semiconductor material, one or more layers of dielectric material, and/or one or more layers of electrically conductive material used to form such structures and interconnect them. Similarly, the MEMS device 1076 may include a structure having any combination of semiconductor material, dielectric material, and/or electrically conductive material. The general structure and fabrication process for MEMS devices and semiconductor structures that include MEMS devices are well known in the art. Therefore, detailed structures of the semiconductor structure 1074 and the MEMS device 1076 are not shown in FIG. 10. A dielectric layer 1078 is formed on the MEMS device 1076 and the integrated circuit 1074. In embodiments, the dielectric layer 1078 is comprised of a hydrogen-free film including, but not limited to, a nitride, oxynitride, oxycarbonitride, and/or oxycarbide of silicon.

In addition to the applications of the capping layer and gate dielectric as previously described, a variety of other applications are possible for films in accordance with embodiments of the present invention. These applications include, but are not limited to, spacer, liner, Cu cap, etch stop, hard mask, interlevel dielectric (ILD), MEMS (Microelectromechanical systems) devices, FET, display, storage devices, permanent layers, disposable layers with improve wet and reactive ion etching (RIE) selectivity, improved chemical mechanical polish (CMP) stop layers, improved barrier layers, through silicon via liner layers and other applications that conventional hydrogen-bearing silicon dielectric materials are normally employed. The use of the hydrogen-free films in accordance with embodiments of the present invention can serve to improve device performance and reliability in thermal, electrical and mechanical aspects. Hydrogen can compromise the quality of films. In particular, it can outgas and cause film defects such as delamination. Furthermore, the presence of hydrogen can cause an unwanted shift in the threshold voltage Vt of a transistor under certain conditions. Therefore, embodiments of the present invention serve to provide improved integrated circuit reliability by fabrication of dielectric films that are hydrogen-free. The hydrogen-free films reduce the damage and instability caused by the presence of hydrogen, thereby improving the quality of integrated circuit devices.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of forming a dielectric film comprising:
introducing a semiconductor substrate into a chamber of a deposition tool;
heating the substrate at a process temperature;
introducing a hydrogen-free precursor into said chamber of the deposition tool, wherein the hydrogen-free precursor comprises tetraisocyanatosilane;
introducing a second precursor selected from the group consisting of N2, O2, O3, N2O, CO2, CO; and
activating a plasma in the chamber.

2. The method of claim 1 where at least one additional hydrogen-free reactive gas is introduced into the chamber of said deposition tool.

3. The method of claim 1 wherein at least one additional inert gas is introduced into the chamber of said deposition tool.

4. The method of claim 1, wherein the substrate is preheated at a process temperature ranging from about 100 degrees Celsius to about 400 degrees Celsius.

5. The method of claim 1, wherein the hydrogen-free precursor is introduced to the chamber at a total gas flow rate ranging from about 30 sccm to about 350 sccm.

6. The method of claim 2, wherein the at least one additional hydrogen-free reactive gas comprises a gas selected from the group consisting of nitrogen, oxygen, nitrous oxide, and carbon dioxide.

7. A method of forming a dielectric film comprising:
introducing a semiconductor substrate into a chamber of a deposition tool;
heating the substrate at a process temperature ranging from about 100 degrees Celsius to about 400 degrees Celsius;
introducing tetraisocyanatosilane into said chamber of the deposition tool a total gas flow rate ranging from about 30 sccm to about 350 sccm;
introducing an additional hydrogen-free reactive gas into the chamber of said deposition tool, wherein the additional hydrogen-free reactive gas comprises a compound of the form $SiN_xO_yC_z$; and
activating a plasma in the chamber.

\* \* \* \* \*